United States Patent
Kang

(10) Patent No.: US 10,886,114 B2
(45) Date of Patent: Jan. 5, 2021

(54) SPUTTERING GAP MEASUREMENT APPARATUS AND MAGNETRON SPUTTERING DEVICE

(71) Applicants: BOE TECHNOLOGY GROUP CO., LTD., Beijing (CN); ORDOS YUANSHENG OPTOELECTRONICS CO., LTD., Inner Mongolia (CN)

(72) Inventor: Yingnan Kang, Beijing (CN)

(73) Assignees: BOE TECHNOLOGY GROUP CO., LTD., Beijing (CN); ORDOS YUANSHENG OPTOELECTRONICS CO., LTD., Inner Mongolia (CN)

( * ) Notice: Subject to any disclaimer, the term of this patent is extended or adjusted under 35 U.S.C. 154(b) by 419 days.

(21) Appl. No.: 15/756,980

(22) PCT Filed: Aug. 10, 2017

(86) PCT No.: PCT/CN2017/096726
§ 371 (c)(1),
(2) Date: Mar. 1, 2018

(87) PCT Pub. No.: WO2018/126685
PCT Pub. Date: Jul. 12, 2018

(65) Prior Publication Data
US 2019/0057850 A1    Feb. 21, 2019

(30) Foreign Application Priority Data

Jan. 3, 2017 (CN) .................... 2017 2 0004344 U

(51) Int. Cl.
*C23C 14/34* (2006.01)
*H01J 37/34* (2006.01)
(Continued)

(52) U.S. Cl.
CPC ............ *H01J 37/3476* (2013.01); *G01B 5/14* (2013.01); *H01J 37/3299* (2013.01);
(Continued)

(58) Field of Classification Search
CPC .............................. H01J 37/3476; G01B 5/14
See application file for complete search history.

(56) References Cited

U.S. PATENT DOCUMENTS

2006/0278522 A1* 12/2006 Kim ...................... C23C 14/042
                                                             204/192.1
2009/0073460 A1    3/2009 Mizuta et al.

FOREIGN PATENT DOCUMENTS

CN        201876224 U      6/2011
CN        202501819 U     10/2012
(Continued)

OTHER PUBLICATIONS

International Search Report & English Translation of Box V of Written Opinion, for PCT Patent Application No. PCT/CN2017/096726, dated Nov. 1, 2017, 13 pages.

*Primary Examiner* — Jason Berman
(74) *Attorney, Agent, or Firm* — Kinney & Lange, P.A.

(57) ABSTRACT

A magnetron sputtering device in one embodiment of the present disclosure includes a support table supporting thereon a base substrate, and a floating mask arranged at a first side of the support table and substantially parallel to the support table. The sputtering gap measurement apparatus includes: a horizontal testing platform arranged on the support table during the measurement, a first edge of the horizontal testing platform being flush with an edge of the first side of the support table in the case that the horizontal testing platform is located at a first position; a first movement mechanism configured to control the horizontal testing platform to move in a direction close to the floating mask, the horizontal testing platform being in contact with the (Continued)

floating mask in the case that the horizontal testing platform has moved to a second position; and a distance measurement mechanism configured to measure a movement distance of the horizontal testing platform from the first position to the second position.

20 Claims, 1 Drawing Sheet

(51) Int. Cl.
      *G01B 5/14*       (2006.01)
      *H01J 37/32*     (2006.01)

(52) U.S. Cl.
      CPC ...... *H01J 37/3405* (2013.01); *H01J 37/3447* (2013.01); *H01J 37/3488* (2013.01); *H01J 2237/24578* (2013.01)

(56) References Cited

FOREIGN PATENT DOCUMENTS

| | | |
|---|---|---|
| CN | 105509615 A | 4/2016 |
| CN | 206300597 U | 7/2017 |

* cited by examiner

SPUTTERING GAP MEASUREMENT APPARATUS AND MAGNETRON SPUTTERING DEVICE

CROSS-REFERENCE TO RELATED APPLICATION

This application is the U.S. national phase of PCT Application No. PCT/CN2017/096726 filed on Aug. 10, 2017, which claims priority to Chinese Patent Application No. 201720004344.9 filed on Jan. 3, 2017, the disclosures of which are incorporated in their entirety by reference herein.

TECHNICAL FIELD

The present disclosure relates to the manufacture of a liquid crystal product, in particular to a sputtering gap measurement apparatus and a magnetron sputtering device.

BACKGROUND

For a Physical Vapor Deposition (PVD) method, a magnetron sputtering operation is performed in a vacuum state, and during the film-forming, a glass substrate needs to be arranged in a vertical state. At this time, the glass substrate is attached onto a quartz plate. A floating mask is connected to a side of a device cavity, so as to mainly control a shape of a resultant film, thereby to influence a circumferential film-forming region. Principally, a distance between the quartz plate and the floating mask is adjusted so as to adjust the film-forming region, and this distance is just a gap value. The film-forming region and uniformity thereof directly depend on the gap value.

Currently, a device for measuring and adjusting the PVD gap value mainly includes a feeler gauge. However, there are the following drawbacks.

(1) It is difficult to provide sufficient measurement stability. A level degree of the feeler gauge may be significantly affected by protrusions at a periphery of the quartz plate. In the case that the feeler gauge is not arranged substantially parallel to the quartz plate, an inaccurate measurement result may probably occur.

(2) After a long-term use, the feeler gauge may be curved, and thereby the erroneous measurement result may probably occur.

(3) Once it is required to modify values of A and B (a value in a vertical direction and a value in a horizontal direction of the gap value respectively) to meet the requirements on a manufacture process, a measurement range of the feeler gauge may be insufficient, and at this time, a new feeler gauge must be provided for the subsequent measurement, resulting in an increase in the manufacture cost.

(4) The measurement results may differ greatly from each other in the case that the feeler gauge is used by different test personnel.

SUMMARY

An object of the present disclosure is to provide a sputtering gap measurement apparatus and a magnetron sputtering device, so as to determine a movement distance of a horizontal testing platform from a first position to a second position as a distance between a support table and a floating mask in a horizontal direction without the use of a feeler gauge, thereby to accurately measure a sputtering gap.

In one aspect, the present disclosure provides in some embodiments a sputtering gap measurement apparatus for a magnetron sputtering device. The magnetron sputtering device includes a support table supporting thereon a base substrate, and a floating mask arranged at a first side of the support table and substantially parallel to the support table. The sputtering gap measurement apparatus includes: a horizontal testing platform arranged on the support table, a first edge of the horizontal testing platform being flush with an edge of the first side of the support table in the case that the horizontal testing platform is located at a first position; a first movement mechanism configured to control the horizontal testing platform to move in a direction close to the floating mask, the horizontal testing platform being in contact with the floating mask in the case that the horizontal testing platform has moved to a second position; and a distance measurement mechanism configured to measure a movement distance of the horizontal testing platform from the first position to the second position.

In a possible embodiment of the present disclosure, the first movement mechanism includes a pedestal arranged on the support table, and the horizontal testing platform is movably arranged on the pedestal. The distance measurement mechanism includes a scale arranged at a side surface of the pedestal. In the case that the horizontal testing platform is located at the first position, a second edge of the horizontal testing platform opposite to the first edge corresponds to a scale value of 0.

In a possible embodiment of the present disclosure, the first movement mechanism further includes a horizontal wheel arranged at a side surface of the horizontal testing platform and a transmission member arranged between the horizontal testing platform and the pedestal. The transmission member is driven by the horizontal wheel, so as to drive the horizontal testing platform to move in a horizontal direction.

In a possible embodiment of the present disclosure, the pedestal includes a first surface on which the horizontal testing platform is arranged and a second surface opposite to the first surface. And a groove corresponding to a protrusion at the first side of the support table is provided in the second surface.

In a possible embodiment of the present disclosure, the sputtering gap measurement apparatus further includes: a first connection rod arranged at the first edge of the horizontal testing platform and substantially perpendicular to the horizontal testing platform; a sheet movably arranged on the first connection rod and substantially parallel to the horizontal testing platform; and a second movement mechanism configured to control the sheet to move along the first connection rod in a direction close to the floating mask, the sheet being in contact with the floating mask in the case that the sheet is located at a third position. The distance measurement mechanism is further configured to measure a distance between the sheet and the horizontal testing platform in a vertical direction in the case that the sheet is located at the third position.

In a possible embodiment of the present disclosure, the distance measurement mechanism further includes a vertical scale arranged at the first edge of the horizontal testing platform. An end of the vertical scale in contact with the horizontal testing platform has a scale value of 0. An outer surface of the vertical scale is located in a plane identical to a side surface of the horizontal testing platform corresponding to the first edge. The sputtering gap measurement apparatus further includes a second connection rod connected to the sheet and capable of moving together with the sheet. The second connection rod is located in a plane identical to the sheet and arranged substantially parallel to the horizontal testing platform. An end of the second connection rod away from the sheet is provided with a connection member in contact with the vertical scale.

In a possible embodiment of the present disclosure, the second movement mechanism further includes a vertical wheel arranged on the first connection rod and a transmission member arranged between the first connection rod and the sheet. The transmission member is driven by the vertical wheel, so as to drive the sheet to move.

In a possible embodiment of the present disclosure, each of the support table and the horizontal testing platform is of a rectangular shape.

In another aspect, the present disclosure provides in some embodiments a magnetron sputtering device including the above-mentioned sputtering gap measurement apparatus.

DETAILED DESCRIPTION OF THE EMBODIMENTS

The present disclosure will be described hereinafter in conjunction with the drawings and embodiments. The following embodiments are for illustrative purposes only, but shall not be used to limit the scope of the present disclosure.

Figure 1:
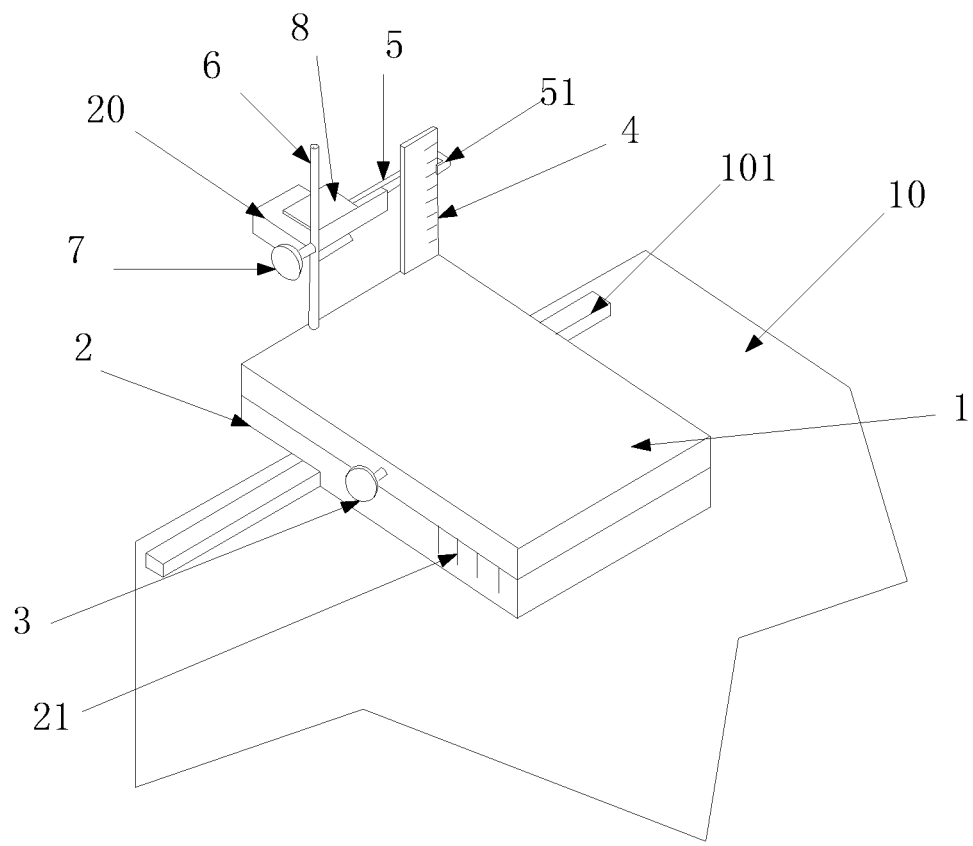
FIG. 1 is a schematic view showing a sputtering gap measurement apparatus according to one embodiment of the present disclosure.

As shown in FIG. 1, the present disclosure provides in some embodiments a sputtering gap measurement apparatus for a magnetron sputtering device. The magnetron sputtering device includes a support table 10 supporting thereon a base substrate, and a floating mask 20 arranged at a first side of the support table 10 and substantially parallel to the support table 10. A distance between the support table 10 and the floating mask 20 is a sputtering gap. The sputtering gap measurement apparatus includes: a horizontal testing platform 1 arranged on the support table 10, a first edge of the horizontal testing platform 1 being flush with an edge of the first side of the support table 10 in the case that the horizontal testing platform 1 is located at a first position; a first movement mechanism configured to control the horizontal testing platform 1 to move in a direction close to the floating mask 20, the horizontal testing platform 1 being in contact with the floating mask 20 in the case that the horizontal testing platform 1 has moved to a second position; and a distance measurement mechanism configured to measure a movement distance of the horizontal testing platform 1 from the first position to the second position.

According to the embodiments of the present disclosure, it is able to determine, through the distance measurement mechanism, the movement distance of the horizontal testing platform 1 from the first position to the second position as a distance between the support table 10 and the floating mask 20 in the horizontal direction without the use of a feeler gauge, thereby to measure the sputtering gap accurately and prolong a service life of the sputtering gap measurement apparatus.

The first movement mechanism may be of various structures, as long as it may be used to control the movement of the horizontal testing platform 1. In a possible embodiment of the present disclosure, the first movement mechanism includes a pedestal 2 arranged on the support table 10 during the measurement, and the horizontal testing platform 1 is movably arranged on the pedestal 2. The distance measurement mechanism includes a scale arranged at a side surface of the pedestal 2 (e.g., scale 21 in FIG. 1 which, in actual use, may extend along the entire side surface of the pedestal so as to meet the requirements on the measurement range). In the case that the horizontal testing platform 1 is located at the first position, a second edge of the horizontal testing platform 1 opposite to the first edge corresponds to a scale value of 0.

The horizontal testing platform 1 is movably arranged on the pedestal 2, and a surface of the pedestal 2 connected to the horizontal testing platform 1 is at a horizontal level, so as to horizontally and stably arrange the horizontal testing platform 1 on the pedestal.

In the embodiments of the present disclosure, the distance measurement mechanism may include the scale arranged at the side surface of the pedestal 2. The horizontal testing platform 1 may move in the direction close to the floating mask 20, and in the case that the horizontal testing platform 1 has moved to the second position, it may be in contact with the floating mask 20. At this time, it is able to determine the movement distance of the horizontal testing platform 1 from the first position to the second position, i.e., a horizontal distance between the support table 10 and the floating mask 20, merely by directly reading a scale value corresponding to the second edge of the horizontal testing platform 1.

In a possible embodiment of the present disclosure, the first movement mechanism further includes a horizontal wheel 3 arranged at a side surface of the horizontal testing platform 1 and a transmission member arranged between the horizontal testing platform 1 and the pedestal 2. The transmission member is driven by the horizontal wheel 3, so as to drive the horizontal testing platform 1 to move in a horizontal direction.

The transmission member may be of various structures. In a possible embodiment of the present disclosure, the transmission member includes a transmission wheel in engagement with the horizontal wheel 3, and a screw rod connected to the transmission wheel and the pedestal 2.

In a possible embodiment of the present disclosure, the pedestal 2 includes a first surface on which the horizontal testing platform 1 is arranged and a second surface opposite to the first surface. And a groove corresponding to a protrusion 101 at the first side of the support table 10 is provided in the second surface.

By virtue of the groove, it is able to stably provide the pedestal 2 on the support table 10, thereby to ensure a level degree of the surface of the pedestal 2 connected to the horizontal testing platform 1.

In a possible embodiment of the present disclosure, the sputtering gap measurement apparatus further includes: a first connection rod 6 arranged at the first edge of the horizontal testing platform 1 and substantially perpendicular to the horizontal testing platform 1; a sheet 8 movably arranged on the first connection rod 6 and substantially parallel to the horizontal testing platform 1; and a second movement mechanism configured to control the sheet 8 to move along the first connection rod 6 in a direction close to the floating mask 20, the sheet 8 being in contact with the floating mask 20 in the case that the sheet 8 is located at a third position. The distance measurement mechanism is further configured to measure a distance between the sheet 8 and the horizontal testing platform 1 in a vertical direction in the case that the sheet 8 is located at the third position.

The distance between the sheet 8 and the horizontal testing platform 1 in the vertical direction is just a distance between the support table 10 and the floating mask 20 in the vertical direction. At this time, it is able for the distance measurement mechanism to accurately measure the distance between the sheet 8 and the horizontal testing platform in the vertical direction in the case that the sheet 8 is located at the third position, thereby to prolong the service life of the sputtering gap measurement apparatus.

In a possible embodiment of the present disclosure, the distance measurement mechanism further includes a vertical scale 4 arranged at the first edge of the horizontal testing platform 1. An end of the vertical scale 4 in contact with the horizontal testing platform 1 has a scale value of 0. An outer surface of the vertical scale 4 is located in a plane identical to a side surface of the horizontal testing platform 1 corresponding to the first edge.

The sputtering gap measurement apparatus further includes a second connection rod 5 connected to the sheet 8 and capable of moving together with the sheet 8. The second connection rod 5 is located in a plane identical to the sheet 8 and arranged substantially parallel to the horizontal testing platform 1. An end of the second connection rod 5 away from the sheet 8 is provided with a connection member 51 in contact with the vertical scale 4.

In the case that the sheet 8 is located at the third position, i.e., in contact with the floating mask 20, a gap value of the sputtering gap in the vertical direction is just a sum of the scale value of the vertical scale 4 corresponding to the connection member 51 and a distance between an upper surface of the horizontal testing platform 1 and the support table 10.

In a possible embodiment of the present disclosure, a scale value corresponding to an end of the vertical scale 4 in contact with the horizontal testing platform 1 is equal to a distance between a surface of the horizontal testing platform 1 where the vertical scale 4 is arranged and the support table 10. In the case of measuring the distance between the floating mask 20 and the support table 10 in the vertical direction, it is merely required to directly read the scale value of the vertical scale 4 corresponding to the connection member 51.

In a possible embodiment of the present disclosure, the second movement mechanism further includes a vertical wheel 7 arranged on the first connection rod 6 and a transmission member arranged between the first connection rod 6 and the sheet 8. The transmission member is driven by the vertical wheel 7, so as to drive the sheet 8 to move.

In a possible embodiment of the present disclosure, each of the support table 10 and the horizontal testing platform 1 is of a rectangular shape.

Through the sputtering gap measurement apparatus provided by the embodiments of the present disclosure, it is able to directly measure the vertical distance and the horizontal distance between the support table 10 and the floating mask 20. In the case that a measurement result is different from a predetermined gap value, a position of the floating mask 20 relative to the support table 10 may be adjusted.

In addition, the horizontal testing platform 1 may be moved by a predetermined distance, the distance between the floating mask 20 and the horizontal testing platform 1 in the horizontal direction may be adjusted in such a manner as to enable the floating mask 20 to be in contact with the support table 10, then the sheet 8 may be moved to a predetermined position, and then the position of the floating mask 20 may be adjusted so as to be in contact with the sheet 8. In this way, it is able to ensure that the sputtering gap has a predetermined value.

To be specific, in the embodiments of the present disclosure, the support table 10 is a quart plate onto which the sputtering gap measurement apparatus is arranged. The groove in the pedestal 2 engages the protrusion 101 on the support table 10, so as to ensure the stability of the sputtering gap measurement apparatus. In addition, the horizontal testing platform 1 is located at the first position, i.e., the second edge of the horizontal testing platform 1 opposite to the first edge corresponds to a scale value of 0, and the sheet 8 is located at a lowest position. Next, the horizontal wheel 3 is rotated to move the horizontal testing platform 1 horizontally to a predetermined position, and the vertical wheel 7 is rotated to move the sheet 8 in the vertical direction to a predetermined position. Next, the floating mask 20 is moved, so that the floating mask 20 is in contact with the horizontal testing platform 1 in the horizontal direction, and in contact with the sheet 8 in the vertical direction. At this time, the distance between the floating mask 20 and the support table 10 is just the predetermined sputtering gap.

According to the sputtering gap measurement apparatus provided by the embodiments of the present disclosure, it is able to ensure the accuracy of the measurement result in a surface-attachment manner, and significantly increase the measurement range. In addition, it is able to measure the fixed sputtering gap, or adjust a position of the floating mask 20 in accordance with a preset value. Further, the pedestal 2 is provided in accordance with a shape of the support table 10, so it is able to firmly provide the sputtering gap measurement apparatus on a surface of the quartz plate (in the embodiments of the present disclosure, the support table 10 is the quartz plate), and ensure a level degree of the horizontal testing platform 1 (through the engagement of the groove in the pedestal 2 and the protrusion 101 at a side of the support table 10). As a result, it is able to perform the measurement in a stable manner, and improve the accuracy of the measurement result.

Figure 2:
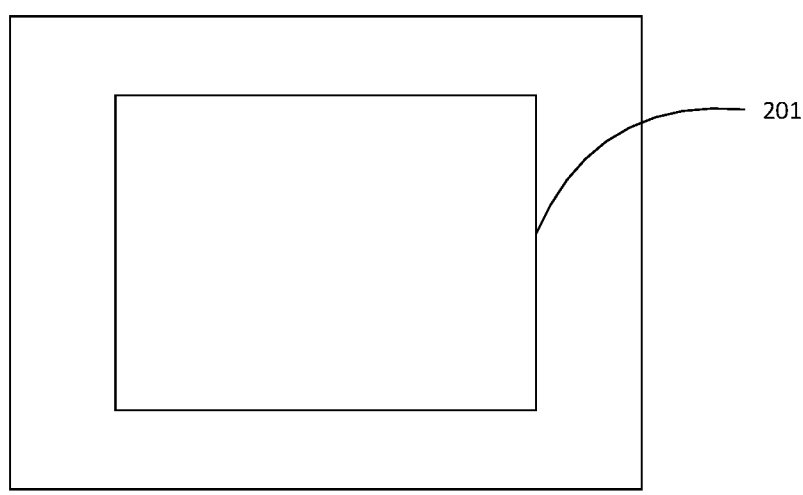
FIG. 2 is a schematic view showing a magnetron sputtering device according to another embodiment of the present disclosure.

As shown in FIG. 2, the present disclosure further provides in some embodiments a magnetron sputtering device 200 including the above-mentioned sputtering gap measurement apparatus 201.

The above are merely the preferred embodiments of the present disclosure, but the present disclosure is not limited thereto. Obviously, a person skilled in the art may make further modifications and improvements without departing from the spirit of the present disclosure, and these modifications and improvements shall also fall within the scope of the present disclosure.

What is claimed is:

1. A sputtering gap measurement apparatus for a magnetron sputtering device, the magnetron sputtering device comprising a support table supporting thereon a base substrate and a floating mask arranged at a first side of the support table and substantially parallel to the support table, the sputtering gap measurement apparatus comprising:

a horizontal testing platform arranged on the support table, a first edge of the horizontal testing platform being flush with an edge of the first side of the support table when the horizontal testing platform is located at a first position;

a first movement mechanism configured to control the horizontal testing platform to move in a direction close to the floating mask, the horizontal testing platform being in contact with the floating mask when the horizontal testing platform has moved to a second position; and a distance measurement mechanism configured to measure a movement distance of the horizontal testing platform from the first position to the second position.

2. The sputtering gap measurement apparatus according to claim 1, wherein
the first movement mechanism comprises a pedestal arranged on the support table, and the horizontal testing platform is movably arranged on the pedestal;
the distance measurement mechanism comprises a scale arranged at a side surface of the pedestal; and
in the case that the horizontal testing platform is located at the first position, a second edge of the horizontal testing platform opposite to the first edge corresponds to a scale value of 0.

3. The sputtering gap measurement apparatus according to claim 2, wherein
the first movement mechanism further comprises a horizontal wheel arranged at a side surface of the horizontal testing platform and a transmission member arranged between the horizontal testing platform and the pedestal; and
the transmission member is driven by the horizontal wheel, so as to drive the horizontal testing platform to move in a horizontal direction.

4. The sputtering gap measurement apparatus according to claim 2, wherein
the pedestal comprises a first surface on which the horizontal testing platform is arranged and a second surface opposite to the first surface; and
a groove corresponding to a protrusion at the first side of the support table is provided in the second surface.

5. The sputtering gap measurement apparatus according to claim 1, further comprising:
a first connection rod arranged at the first edge of the horizontal testing platform and substantially perpendicular to the horizontal testing platform;
a sheet movably arranged on the first connection rod and substantially parallel to the horizontal testing platform; and
a second movement mechanism configured to control the sheet to move along the first connection rod in a direction close to the floating mask, the sheet being in contact with the floating mask in the case that the sheet is located at a third position,
wherein the distance measurement mechanism is further configured to measure a distance between the sheet and the horizontal testing platform in a vertical direction in the case that the sheet is located at the third position.

6. The sputtering gap measurement apparatus according to claim 5, wherein
the distance measurement mechanism further comprises a vertical scale arranged at the first edge of the horizontal testing platform;
an end of the vertical scale in contact with the horizontal testing platform has a scale value of 0;
an outer surface of the vertical scale is located in a plane identical to a side surface of the horizontal testing platform corresponding to the first edge;
the sputtering gap measurement apparatus further comprises a second connection rod connected to the sheet and capable of moving together with the sheet;
the second connection rod is located in a plane identical to the sheet and arranged substantially parallel to the horizontal testing platform; and
an end of the second connection rod away from the sheet is provided with a connection member in contact with the vertical scale.

7. The sputtering gap measurement apparatus according to claim 5, wherein
the second movement mechanism further comprises a vertical wheel arranged on the first connection rod and a transmission member arranged between the first connection rod and the sheet; and
the transmission member is driven by the vertical wheel, so as to drive the sheet to move.

8. The sputtering gap measurement apparatus according to claim 1, wherein each of the support table and the horizontal testing platform is of a rectangular shape.

9. A magnetron sputtering device, comprising a support table configured to support thereon a base substrate, a floating mask arranged at a first side of the support table and substantially parallel to the support table, and a sputtering gap measurement apparatus, wherein the sputtering gap measurement apparatus comprises:
a horizontal testing platform arranged on the support table, a first edge of the horizontal testing platform being flush with an edge of the first side of the support table when the horizontal testing platform is located at a first position;
a first movement mechanism configured to control the horizontal testing platform to move in a direction close to the floating mask, the horizontal testing platform being in contact with the floating mask when the horizontal testing platform has moved to a second position; and
a distance measurement mechanism configured to measure a movement distance of the horizontal testing platform from the first position to the second position.

10. The magnetron sputtering device according to claim 9, wherein
the first movement mechanism comprises a pedestal arranged on the support table, and the horizontal testing platform is movably arranged on the pedestal;
the distance measurement mechanism comprises a scale arranged at a side surface of the pedestal; and
in the case that the horizontal testing platform is located at the first position, a second edge of the horizontal testing platform opposite to the first edge corresponds to a scale value of 0.

11. The magnetron sputtering device according to claim 10, wherein
the first movement mechanism further comprises a horizontal wheel arranged at a side surface of the horizontal testing platform and a transmission member arranged between the horizontal testing platform and the pedestal; and
the transmission member is driven by the horizontal wheel, so as to drive the horizontal testing platform to move in a horizontal direction.

12. The magnetron sputtering device according to claim 10, wherein
the pedestal comprises a first surface on which the horizontal testing platform is arranged and a second surface opposite to the first surface; and
a groove corresponding to a protrusion at the first side of the support table is provided in the second surface.

13. The magnetron sputtering device according to claim 9, wherein
the sputtering gap measurement apparatus further comprises: a first connection rod arranged at the first edge of the horizontal testing platform and substantially perpendicular to the horizontal testing platform;

a sheet movably arranged on the first connection rod and substantially parallel to the horizontal testing platform; and a second movement mechanism configured to control the sheet to move along the first connection rod in a direction close to the floating mask, the sheet being in contact with the floating mask in the case that the sheet is located at a third position, wherein the distance measurement mechanism is further configured to measure a distance between the sheet and the horizontal testing platform in a vertical direction in the case that the sheet is located at the third position.

14. The magnetron sputtering device according to claim 13, wherein the distance measurement mechanism further comprises a vertical scale arranged at the first edge of the horizontal testing platform;

an end of the vertical scale in contact with the horizontal testing platform has a scale value of 0;

an outer surface of the vertical scale is located in a plane identical to a side surface of the horizontal testing platform corresponding to the first edge;

the sputtering gap measurement apparatus further comprises a second connection rod connected to the sheet and capable of moving together with the sheet;

the second connection rod is located in a plane identical to the sheet and arranged substantially parallel to the horizontal testing platform; and an end of the second connection rod away from the sheet is provided with a connection member in contact with the vertical scale.

15. The magnetron sputtering device according to claim 13, wherein the second movement mechanism further comprises a vertical wheel arranged on the first connection rod and a transmission member arranged between the first connection rod and the sheet; and the transmission member is driven by the vertical wheel, so as to drive the sheet to move.

16. The magnetron sputtering device according to claim 9, wherein each of the support table and the horizontal testing platform is of a rectangular shape.

17. The sputtering gap measurement apparatus according to claim 2, wherein the scale arranged at the side surface of the pedestal extends along the entire side surface of the pedestal.

18. The magnetron sputtering device according to claim 10, wherein the scale arranged at the side surface of the pedestal extends along the entire side surface of the pedestal.

19. The sputtering gap measurement apparatus according to claim 3, wherein the transmission member includes a transmission wheel in engagement with the horizontal wheel, and a screw rod connected to the transmission wheel and the pedestal.

20. The magnetron sputtering device according to claim 11, wherein the transmission member includes a transmission wheel in engagement with the horizontal wheel, and a screw rod connected to the transmission wheel and the pedestal.

* * * * *